(12) United States Patent
Terasaki et al.

(10) Patent No.: US 8,308,471 B2
(45) Date of Patent: Nov. 13, 2012

(54) MOLD, MOLD PRODUCTION PROCESS, PROCESSING APPARATUS, AND PROCESSING METHOD

(75) Inventors: Atsunori Terasaki, Kawasaki (JP); Junichi Seki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1029 days.

(21) Appl. No.: 12/091,845

(22) PCT Filed: Mar. 14, 2008

(86) PCT No.: PCT/JP2008/055192
§ 371 (c)(1),
(2), (4) Date: Apr. 28, 2008

(87) PCT Pub. No.: WO2008/114852
PCT Pub. Date: Sep. 25, 2008

(65) Prior Publication Data
US 2009/0092791 A1    Apr. 9, 2009

(30) Foreign Application Priority Data
Mar. 14, 2007  (JP) ................................. 2007-064496

(51) Int. Cl.
*A01J 21/00* (2006.01)
(52) U.S. Cl. .................... 425/385; 425/150; 264/293
(58) Field of Classification Search .................. 425/385, 425/150; 264/293
See application file for complete search history.

(56) References Cited

U.S. PATENT DOCUMENTS

| | | | |
|---|---|---|---|
| 6,653,030 B2 * | 11/2003 | Mei et al. .................... 430/5 |
| 6,916,511 B2 | 7/2005 | Lee et al. | |
| 7,157,015 B2 | 1/2007 | Shimizu et al. ................. 216/24 |
| 2004/0211753 A1 | 10/2004 | Shimizu et al. ................. 216/26 |
| 2005/0005801 A1 | 1/2005 | Thallner ....................... 101/483 |

(Continued)

FOREIGN PATENT DOCUMENTS

CN  1527793 A  9/2004
(Continued)

OTHER PUBLICATIONS

English translation of Korean Office Action dated Jun. 14, 2011, issued in counterpart Korean patent application No. 10-2009-7020827.

(Continued)

*Primary Examiner* — Joseph Del Sole
*Assistant Examiner* — David N Brown, II
(74) *Attorney, Agent, or Firm* — Fitzpatrick, Cella, Harper & Scinto

(57) ABSTRACT

A mold for imprinting a pattern onto a member to be processed. The mold includes a mold body having a front surface, at which an imprint pattern is formed, and a rear surface opposite from the front surface. A coating layer covers the front surface of the mold body, and a coating layer covers the rear surface of the mold body. An alignment mark as an object to be subjected to optical observation is provided at the front surface of the mold body. The coating layer for covering the rear surface includes (i) a hole for observation of the alignment mark and (ii) a stress adjusting pattern corresponding to a density of the imprint pattern. The hole for observation is formed at the rear surface of the mold body opposite from the alignment mark, and the stress adjusting pattern is formed at the rear surface of the mold body opposite from the imprint pattern.

8 Claims, 6 Drawing Sheets

U.S. PATENT DOCUMENTS

| | | | |
|---|---|---|---|
| 2006/0032437 A1* | 2/2006 | McMackin et al. | 118/100 |
| 2006/0266916 A1* | 11/2006 | Miller et al. | 249/134 |
| 2006/0272535 A1 | 12/2006 | Seki et al. | 101/492 |
| 2006/0273488 A1 | 12/2006 | Seki et al. | 264/293 |
| 2006/0279004 A1 | 12/2006 | Suehira et al. | 257/797 |
| 2006/0279022 A1 | 12/2006 | Seki et al. | 264/320 |
| 2007/0054097 A1* | 3/2007 | Suehira et al. | 428/195.1 |
| 2008/0042320 A1 | 2/2008 | Seki et al. | 264/293 |

FOREIGN PATENT DOCUMENTS

| | | |
|---|---|---|
| EP | 1 726 991 A2 | 11/2006 |
| EP | 1 362 005 B1 | 5/2007 |
| JP | 2003-077807 | 3/2003 |
| JP | 2004-148494 | 5/2004 |
| WO | 02/064496 A2 | 8/2002 |

OTHER PUBLICATIONS

Written Opinion of the International Searching Authority mailed Nov. 18, 2008, issued in corresponding International Application No. PCT/JP2008/055192.

International Search Report dated Nov. 11, 2008, which issued in corresponding International Application No. PCT/JP2008/055192.

Stephen Y. Chou, et al., "Imprint of Sub-25 nm Vias and Trenches in Polymers", Appl. Phys. Lett. 67 (21), Nov. 1995, pp. 3114-3116.

Korean Office Action dated Jun. 14, 2011, issued in counterpart Korean patent application No. 10-2009-7020827, with a Japanese translation.

Chinese Office Action dated Apr. 28, 2011, issued in counterpart Chinese patent application No. 200880007687.4, with an English translation.

* cited by examiner

FIG. 1A
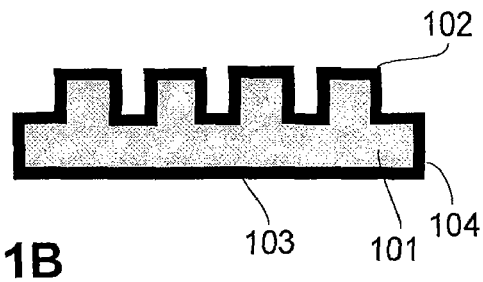
FIG. 1B
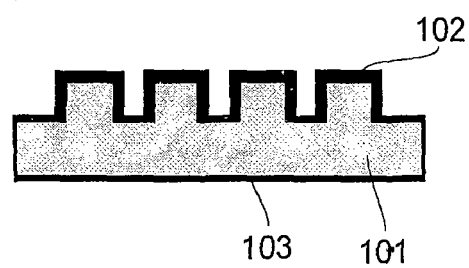
FIG. 1C
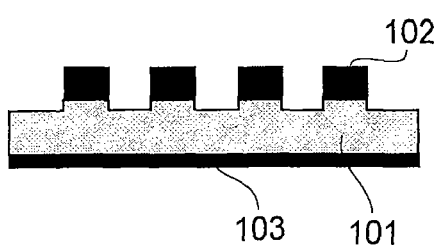
FIG. 1D
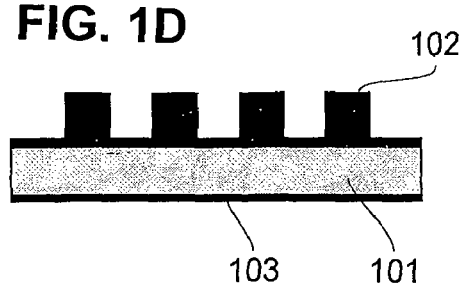
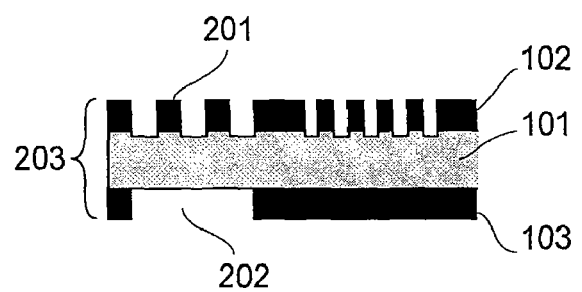
FIG. 2

US 8,308,471 B2

MOLD, MOLD PRODUCTION PROCESS, PROCESSING APPARATUS, AND PROCESSING METHOD

This application is a U.S. national stage application of PCT International Application No. PCT/JP2008/055192, filed Mar. 14, 2008, and which claims priority from Japanese patent application number 2007-064496, filed Mar. 14, 2007, both of which are incorporated by reference herein in their entirety.

TECHNICAL FIELD

The present invention relates to a mold, a mold production process, a processing apparatus, and a processing method.

BACKGROUND ART

In recent years, a fine processing technology for transferring a fine structure provided on a mold onto a member to be processed, such as a resin material, a metallic material, or the like, has been developed and has received attention. This technology is called nanoimprint or nanoembossing, and provides a processing resolving power on the order of several nanometers. For this reason, this technology is expected to be applied to a next-generation semiconductor manufacturing technology in place of a light exposure device, such as a stepper, a scanner, or the like. Further, the technology is capable of effecting simultaneous processing of a three-dimensional structure at a wafer level. For this reason, the technology is expected to be applied to a wide variety of fields as manufacturing technologies, and the like, for optical devices, such as photonic crystals, and the like, biochips, such as μ-TAS (micro total analysis system), etc.

When processing using such imprint is applied to the semiconductor manufacturing technology, e.g., as described in Appl. Phys. Lett., Vol. 67, Issue 21, pages 3114-3316 (1995) by Stephan Y. Chou et al., the processing is performed in the following manner.

That is, with respect to a work (workpiece), including a substrate (e.g., a semiconductor wafer), as a member to be processed, and a photocurable resin material disposed on the member to be processed, a mold provided with a desired imprint pattern is abutted and pressed against the photocurable resin material, followed by ultraviolet irradiation to cure the photocurable resin material. As a result, the imprint pattern is transferred onto the resin material layer. With the resin material layer as a mask layer, etching, or the like, is performed, to form a pattern on the substrate.

With respect to a mold used for such imprint, it is known that a coating layer is formed, on a surface of a mold body, of a material different from a material of the mold body, in some cases.

U.S. Pat. No. 6,916,511, shows, in FIG. 9, a coating layer 902 formed of silicon carbide, silicon nitride, or the like, on a surface of a mold body 90, to constitute a mold.

This coating layer functions as a protective layer for ensuring the strength of the mold surface.

However, the mold having the coating layer formed for ensuring the strength of the mold surface has been accompanied with such a problem that flatness is lost due to stress exerted at an interface between the mold and the coating layer. More specifically, as shown in FIG. 10, due to different materials for the mold body 901 and the coating layer 902, stress acts on the interface between the mold body 901 and the coating layer 902, to cause a phenomenon such that the mold is bent and deformed in some cases. As a result, the flatness of the mold is lost and, therefore, in-plane uniformity of imprint cannot be obtained.

In order to solve the problem of loss of the flatness, when the coating layer is formed at the entire rear surface of the mold, flatness is retained, but the following problems have arisen during alignment, through optical observation.

For example, even when a transparent material capable of transmitting therethrough optically observable light in a specific wavelength range is used, in a case when an opaque material incapable of optical observation is used for the coating layer, observation of an alignment mark is hindered. Further, even in a case when an optically observable transparent material is used for both the mold and the coating layer, light for optical observation can be reflected at the interface between the mold and the coating layer formed at the rear surface of the mold. In this case, when a thickness of the coating layer is close to a coherence length of observation light, unnecessary interference is caused to occur, thus hindering optical observation, in some cases.

DISCLOSURE OF THE INVENTION

The present invention has been accomplished in view of the above-described problems.

A principal object of the present invention is to provide a mold provided with a coating layer capable of optical observation during alignment, without losing its flatness.

Another object of the present invention is to provide a process for producing the mold, a processing apparatus using the mold, and a processing method using the mold.

According to an aspect of the present invention, a mold, for imprinting a pattern onto a member to be processed, comprises:

a mold body having a front surface, at which the pattern is formed, and a rear surface opposite from the front surface;

a coating layer for covering the front surface and the rear surface of the mold body; and a coating layer for covering the rear surface of the mold body, wherein the coating layer for covering the rear surface of the mold body is partially provided with an opening at the rear surface of the mold body.

The mold body of the mold may be formed of a material transparent to visible light, or at least light in a portion of a wavelength range of optically observable light, and each of the coating layers may be formed of a transparent material having an optical characteristic different from that of the mold body or an opaque material. When each of the coating layers is formed of the transparent material, the transparent material may have an optical transmittance, capable of curing a photocurable resin material constituting the member to be processed, with respect to at least a portion of a wavelength range of ultraviolet rays. The transparent material and the photocurable resin material may have a difference in refractive index, therebetween with respect to the portion of the wavelength range of the optically observable light. Each of the coating layers may be formed of an electroconductive material. The coating layer at the rear surface of the mold body may be provided with a stress adjusting pattern corresponding to a density of a pattern at the front surface of the mold body. The coating layer at the front surface of the mold body and the coating layer at the rear surface of the mold body may be integral with each other.

According to another aspect of the present invention, a mold production process, used when a pattern is imprinted onto a member to be processed, comprises:

a step of forming a coating layer at a front surface of a substrate and a coating layer at a rear surface of the substrate;

a step of forming a mold having an imprint pattern coated with the coating layer at a front surface of the mold by forming and patterning a resist on the coating layer formed at the front surface of the substrate, and then, by etching the coating layer formed at the front surface of the substrate through the patterned resist as a mask; and a step of forming an opening at the rear surface of the coating layer by forming and patterning a resist on the coating layer formed at a rear surface of the mold, and then, by etching the coating layer formed at the rear surface of the mold through the patterned resist as a mask.

According to a further aspect of the present invention, a mold production process comprises:

a step of forming a mold having an imprint pattern by forming and patterning a resist on a substrate, and then, by etching the substrate through the patterned resist as a mask;

a step of forming a coating layer at a front surface of the mold including the imprint pattern and forming a coating layer at a rear surface of the mold; and a step of conforming an opening at the rear surface of the coating layer by forming and patterning a resist on the coating layer formed at a rear surface of the mold, and then, by etching the coating layer formed at the rear surface of the mold through the patterned resist as a mask.

In the above mold production processes, in the step of forming the opening at the rear surface of the coating layer, the opening may be a hole for observation of an alignment mark formed at a portion of the rear surface of the coating layer, and a stress adjusting pattern corresponding to a density of the pattern of the mold.

According to a further aspect of the present invention, a processing apparatus for forming a pattern of a mold on a member to be processed includes the above-described mold.

According to a further aspect of the present invention, a processing method for forming a pattern of a mold on a member to be processed, comprises using the above-described mold. In the processing method, when the pattern of the mold is formed on the member to be processed, alignment marks of the member to be processed and the mold may be optically observed through the opening provided to the coating layer at the rear surface of the mold body, to effect alignment.

These and other objects, features and advantages of the present invention will become more apparent upon a consideration of the following description of the preferred embodiments of the present invention, taken in conjunction with the accompanying drawings.

BRIEF DESCRIPTION OF THE DRAWINGS

FIGS. 1A to 1D are schematic views for illustrating forms of a coating when a mold, provided with a hole for observation, is provided in a coating layer formed at a rear surface of the mold, in Embodiment 1 of the present invention.

FIG. 2 is a schematic sectional view for illustrating a constitutional embodiment of the mold provided with the hole for observation in Embodiment 1 of the present invention.

BEST MODE FOR CARRYING OUT THE INVENTION

Figure 3:
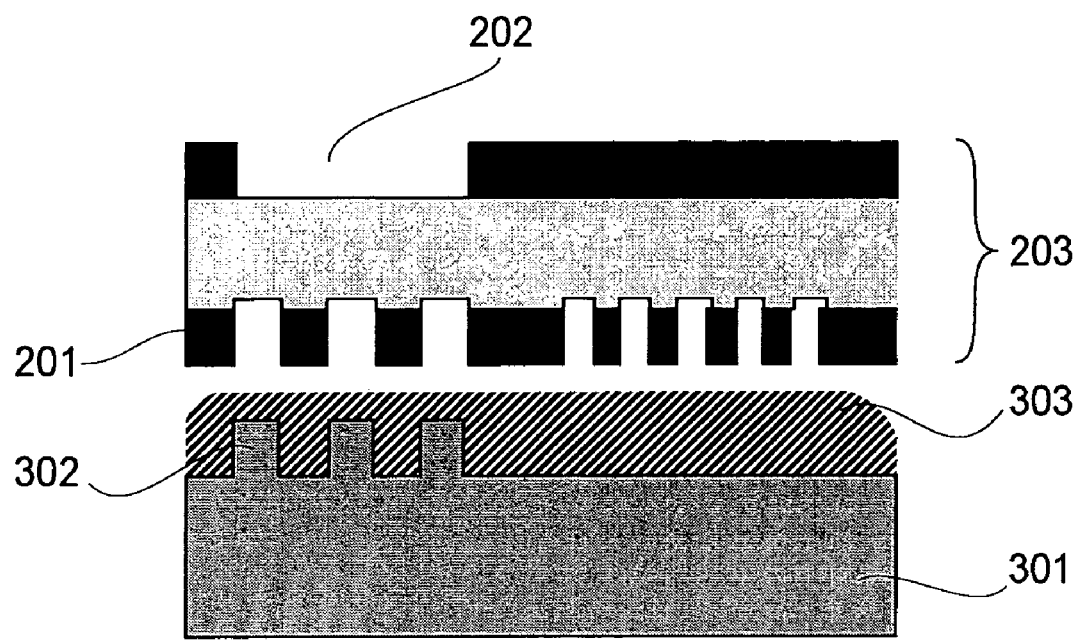
FIG. 3 is a schematic sectional view for illustrating a method of performing optical observation with the mold in Embodiment 1 of the present invention.

In an embodiment of the present invention, a mold is constituted by applying the above-described features of the present invention, so that stress is canceled by forming a coating layer at both a front surface and a rear surface of the mold. In addition, a portion of the coating layer formed at the rear surface of the mold is provided with a hole for observation, so as to allow optical observation, when alignment is performed from the rear surface of the mold. During the alignment, a main body of the mold is constituted by a material transparent to visible light, or at least light in a wavelength range of a portion of optically observable light, and the coating layer is constituted by a transparent material having an optical characteristic different from that of the mold body or an opaque material. By applying such a mold to a processing apparatus for forming a pattern of the mold on a member to be processed, it is possible to improve alignment accuracy. Further, by performing alignment using the mold through optical observation of alignment marks of the member to be processed, and the mold from the above-described hold for observation, it is possible to realize a processing method capable of alignment with accuracy.

Specific embodiments of the present invention will now be described.

Embodiment 1

In this embodiment, a mold provided with a coating layer capable of being optically observed during alignment, without losing flatness of the mold, will be described.

FIGS. 1A to 1D are schematic sectional views for illustrating available coating forms when a mold having a coating layer is provided with a hole for observation at a rear surface of the mold.

FIG. 2 is a schematic sectional view for illustrating a structure of the mold provided with the hole for observation at the rear surface of the mold.

In FIGS. 1A to 1D and 2, a mold 203 includes a mold body 101, a coating layer 102, a coating layer 103, a coating layer 104, an object 201 to be observed, and a hole 202 for optical observation.

With reference to FIGS. 1A to 1D, the available coating forms of the mold with the coating layer will be described.

As one of the coating forms, as shown in FIG. 1A, it is possible to employ such a form that all surfaces of the mold body 101 are coated with the coating layer 102 to 104 by forming not only the coating layers 102 and 103 at the front surface and the rear surface of the mold, but also, the coating layer 104 at side surfaces of the mold.

As another coating form, as shown in FIG. 1B, it is possible to employ such a form that the front surface and the rear surface of the mold are coated with the coating layers, but the side surfaces of the mold are exposed, i.e., not coated with the coating layer.

As another coating form, as shown in FIG. 1C, it is possible to employ such a form that projections or a portion thereof of a pattern of the front surface of the mold is coated with the coating layer 102.

As another coating form, as shown in FIG. 1D, it is possible to employ such a form that the front surface of the mold is coated with the coating layer, so as to form an imprint pattern.

The material for the mold body 101 is a transparent material, on which the coating layers 102 and 103 are formed, at least at the front surface and the rear surface of the mold. The coating layers 102 and 103 are selected from materials different in optical characteristic than those of the opaque material and the material for the mold body 101.

Herein, "transparent" means that the material is capable of transmitting therethrough visible light, or at least light in a portion of a wavelength range of optically observable light.

The materials for the coating layers 102, 103 and 104 may be identical to or different from each other, and are selected from appropriate material and thickness thereof, capable of canceling stresses at the front surface and the rear surface. By employing such a constitution, the coating layer at the front surface can be formed in a desired thickness.

Next, a constitutional embodiment of the mold provided with a hole for observation to the coating layer at the rear surface of the mold, in this embodiment, will be described with reference to FIG. 2.

In the constitutional embodiment of FIG. 2, the object 201 to be observed is formed at the front surface of the mold and the hole 202 for observation is formed at the front surface of the mold, by employing the coating form shown in FIG. 1B.

Referring to FIG. 2, there is no coating material in an area 202. A resultant mold 203 is effective, e.g., in the case of performing alignment of a substrate 201 with the mold 203 through observation from the rear surface of the mold 203, as shown in FIG. 3. More specifically, during the alignment for imprint, a pattern 302 on the substrate side and a pattern 201 on the mold side to be observed are used as alignment marks. The alignment is performed by optical observation of these alignment marks through the hole 202 for observation, as the opening formed in the coating layer at the rear surface of the mold body, so that it is possible to imprint the mold pattern onto a resin material 303 for imprint as the member to be processed. As described above, when the mold in the constitutional embodiment shown in FIG. 2 of the present invention is used, it is possible to observe the mark at the front surface of the mold, from the rear surface of the mold through the hole 202 for observation, and the transparent mold body 101.

The above-described method can also be used for both optical imprint using ultraviolet irradiation and terminal imprint.

The material for the mold body 101 may be selected from transparent materials, such as silicon oxide, calcium fluoride, silicon nitride, titanium oxide, indium tin oxide (ITO), zinc oxide, and the like.

The material for the coating layers 102, 103 and 104 may be selected from opaque materials, such as metal, silicon, silicon carbide, and the like, but may also be selected from materials different in optical characteristic than those of the material for the mold body 101.

In a case when a transparent substance is used as the material for the coating layers, there is an advantage such that the mark on the substrate side can be clearly observed. The transparent material for the coating layers can be selected from materials, different from the material for the mold body 101, from transparent materials, such as silicon oxide, aluminum oxide, calcium fluoride, silicon nitride, titanium oxide, ITO, zinc oxide, and the like.

Even in a case when the opaque material is selected as the material for the coating layers, in the mold in the constitutional embodiment of FIG. 2, there is a cutting portion of the coating layer 102 at the front surface of at least the object 201, to be observed at the front surface of the mold, so that it is possible to effect optical observation through the hole 202 for observation.

In a case when the transparent material is selected as the material for the coating layers, it is possible to effect optical observation, but when a thickness of the coating layer 103 at the rear surface is close to a coherence length for observation light, the thickness can cause unnecessary interference, to hinder the observation. However, in the mold of the constitutional embodiment of FIG. 2, there is the hole 202 for observation, so that such a hindrance is not caused to occur, with the result that alignment for imprint can be effected. The mold having such a constitution can be used for both of the thermal imprint and the optical imprint. Particularly, in a case when the mold is used for the optical imprint, the material for the coating layers may desirably be such a transparent material that it has an optical transmittance capable of curing a photocurable resin material with respect to at least light in a portion of a wavelength range of ultraviolet rays (light).

Further, although the materials for the mold body and the coating layers are selected from the materials different in optical characteristic from each other, as described above, in a case of effecting the optical imprint, it is desirable that the material for the coating layers is selected from materials having a refractive index different from that of the photocurable resin material.

Figure 4:
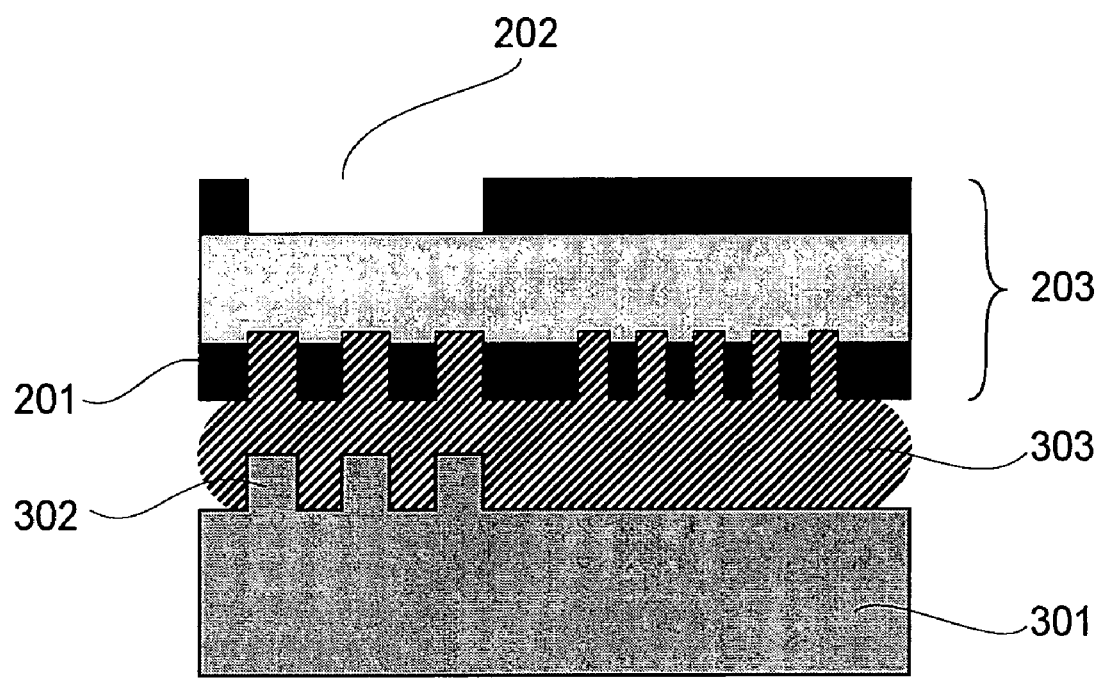
FIG. 4 is a schematic sectional view for illustrating a problem in a case when the coating layer of the mold in Embodiment 1 of the present invention has a refractive index equal to or close to a photocurable resin material, during optical observation with the mold.

In a case when the photocurable resin material and the material for the coating layers have identical or close refractive index values, as shown in FIG. 4, when the photocurable resin material contacts the front surface of the mold, the alignment mark on the mold side is less visible. By using the material different in refractive index from the photocurable resin material in the wavelength range of observation light, it is possible to observe the alignment mark on the mold.

Generally, the photocurable resin material has a refractive index of about 1.5, and as the material for the coating layers, a transparent material having a refractive index providing a difference of 0.2 or more with respect to the refractive index of the photocurable resin material. The transparent material can be selected from, e.g., aluminum oxide (n (refractive index)≈1.78), silicon nitride (n≈2.0), titanium oxide (n≈2.4), ITO (n≈1.78), zinc oxide (n≈2.0), and the like. It is also possible to use another transparent material having a lower refractive index in the mold of this embodiment, as long as it can provide a sufficient difference in refractive index with respect to the refractive index of the photocurable resin material.

Figure 5:
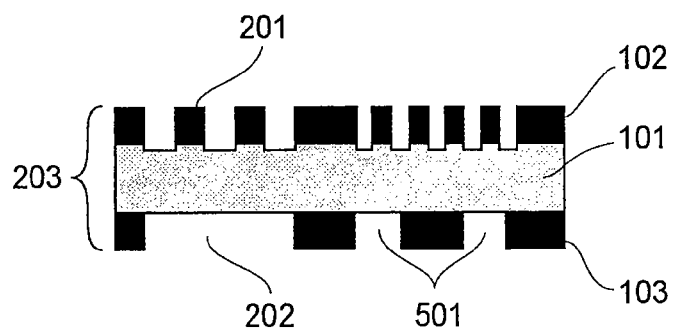
FIG. 5 is a schematic sectional view for illustrating a constitutional embodiment of a mold provided with a coating layer formed at a rear surface of the mold, depending on a pattern density at a front surface of the mold, in Embodiment 1 of the present invention.

The above description is made based on the premise that the coating layer at the rear surface is formed in a uniform film, but there is a possibility that a difference in stress exerted on the mold is caused due to a degree of sparseness/denseness of the pattern at the front surface. In such a case, e.g., as shown in FIG. 5, formation of a pattern 501 at the rear surface in correspondence with a density of the front surface pattern is effective. As a result, a difference in in-plane stress can be further strictly corrected.

Embodiment 2

In this embodiment, constitutional examples of a production process of a mold provided with a coating layer capable of optical observation when alignment is effected, without losing flatness, will be described with reference to FIGS. 6A to 8C.

Figure 6A:
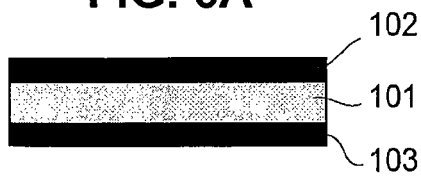
FIGS. 6A to 6E, FIGS. 7A to 7C, and FIGS. 8A to 8C are schematic sectional views for illustrating a production process of a mold in Embodiment 2 of the present invention.

(1) Referring to FIG. 6A, on a mold body 101, a coating layer 102 is formed at a front surface of the mold body 101 and a coating layer 103 is formed at a rear surface of the mold body 101.

The coating layers 102 and 103 may be formed by, e.g., such a method that these layers are formed at one time at both surfaces of the mold body through LP-CVD, and such a method that these layers are formed layer by layer at one surface of the mold body through P-CVD, sputtering, or the like. The materials for the coating layers 102 and 103 may be the same material or may be different materials.

Figure 6B:

(2) On the coating layer 102 at the front surface of the mold, a mask of a resist 601 is formed (FIG. 6B). A pattern method may include, e.g., light exposure using a stepper, a scanner, or the like, or lithography using an electron beam.

Figure 6C:
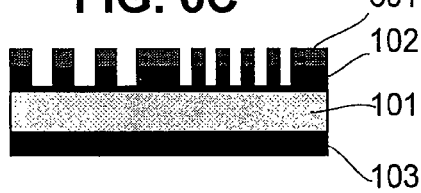

(3) The coating layer 102 at the front surface is etched through the resist 601 as the mask (FIG. 6C). This etching is continued until an intermediary portion or the front surface of the mold body 101 is exposed. Thereafter, the mold body 101 may be etched through the resist 601 and/or the coating layer 102 as the mask. After etching, the resist 601 is removed.

Figure 6D:

(4) On the coating layer 103 at the rear surface of the mold, a mask of a resist 602 is formed (FIG. 6D). The resultant pattern may also contain a pattern for stress adjustment, in addition to a hole for observation.

Figure 6E:
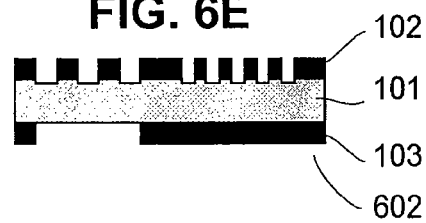

(5) The coating layer 103 at the rear surface is etched (FIG. 6E). Thereafter, the mold body 101 may also be etched through the resist 602 and/or the coating layer 103.

Figure 7A:
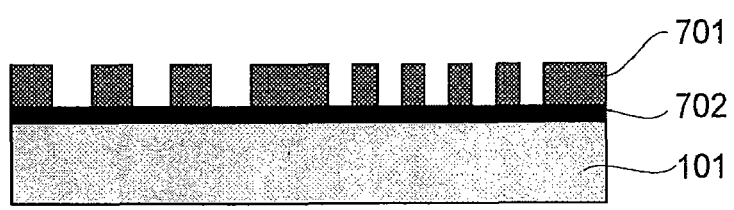
Figure 7B:
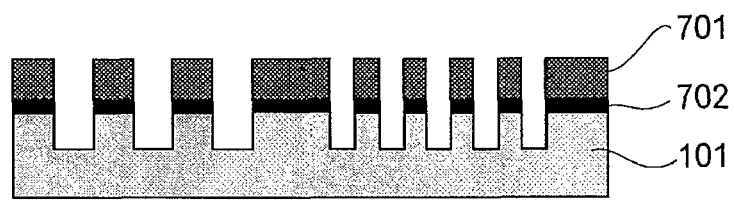
Figure 7C:
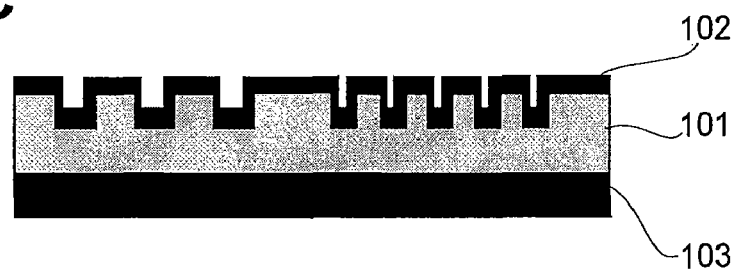

FIGS. 7A to 7C illustrate a method of forming the coating layers 102 and 103 after the front surface of the mold is etched.

(1) On a substrate for constituting the mold body 101, a mask of a resist 701 is formed (FIG. 7A). Alternatively, it is possible to have a hard mask layer 702 interposed between the resist 701 and the substrate for constituting the mold body.

(2) The substrate for the mold body 101 is etched through the resist 701 as the mask (FIG. 7B). In the case of using the hard mask layer 702, the etching of the mold body may also be performed through a combination of the resist 701 and the hard mask layer 702, or the hard mask layer 702 after the resist 701 is removed.

(3) On the mold body 101, the coating layer 102 is formed at the front surface of the mold body 101, and the coating layer 103 is formed at the rear surface of the mold body 101 (FIG. 7C).

The coating layers 102 and 103 may be formed by, e.g., such a method that these layers are formed at one time at both surfaces of the mold body through LP-CVD, and such a method that these layers are formed layer by layer at one surface of the mold body through P-CVD, sputtering, or the like. The materials for the coating layers 102 and 103 may be the same material or may be different materials.

(4) The patterning of the coating layer 103 at the rear surface of the mold body 101 is performed in the same manner as in the case of FIGS. 6D and 6E.

The patterning of the coating layer 102 may also be performed by a lift-off method without performing the etching.

Figure 8A:
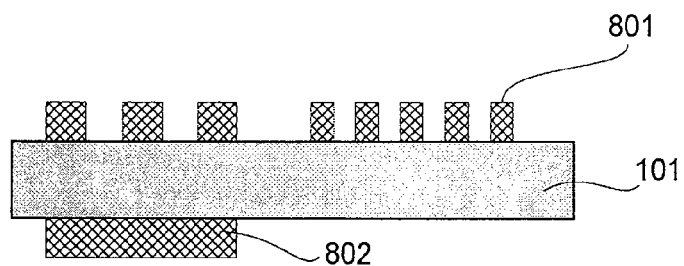
Figure 8B:
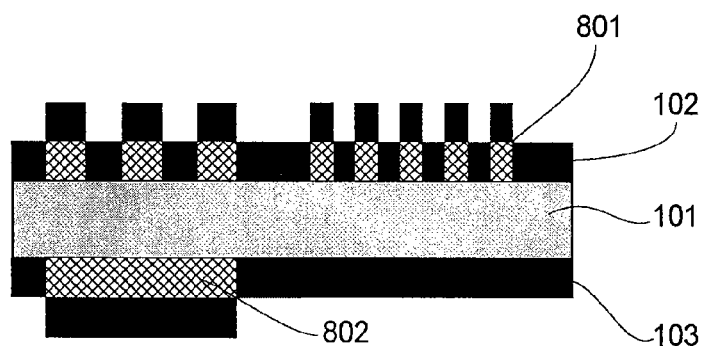
Figure 8C:
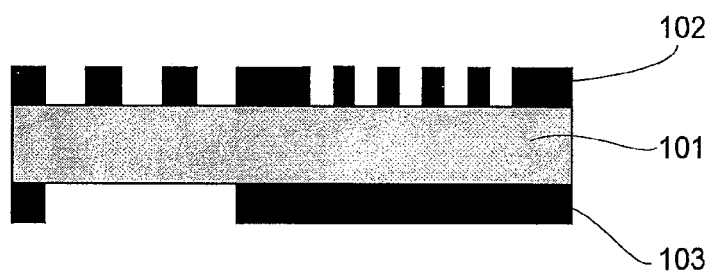
Figure 9:
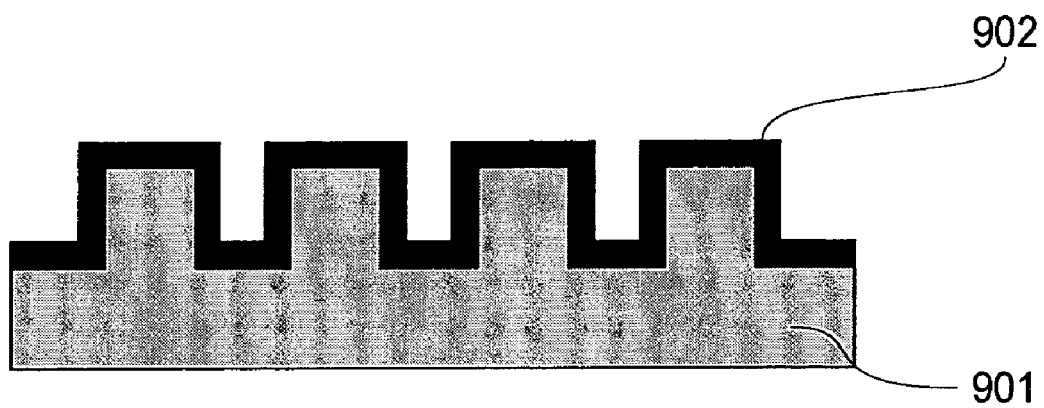
FIG. 9 is a schematic sectional view for illustrating a conventional mold.
Figure 10:
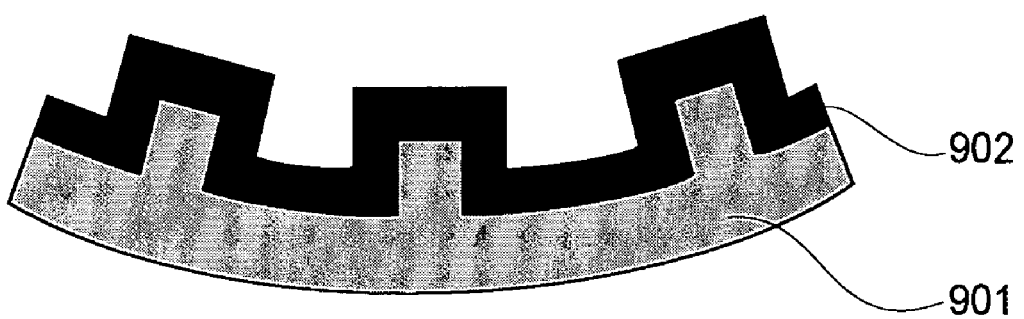
FIG. 10 is a schematic sectional view for illustrating a problem with the conventional mold.

The lift-off method is shown in FIGS. 8A to 8C.

(1) On the mold body 101, a mask of a resist 801 is formed at a front surface of the mold body 101 and a mask of a resist 802 is formed at a rear surface of the mold body 101 (FIG. 8A).

(2) On the mold body 101, the coating layer 102 is firmed at the front surface and the coating layer 103 is formed at the rear surface (FIG. 8B).

(3) By the lift-off method, patterns are formed at the front surface and the rear surface of the mold body 101 (FIG. 8C).

It is also possible to perform the above-described steps independently with respect to the front surface and the rear surface of the mold body 101. Further, it is possible to employ the lift-off method for one of the surfaces and the etching for the other surface.

The coating layer can function as a layer for optical measurement, as described above, but can also be used for the purpose of ensuring a strength of the resultant mold to suppress an occurrence of scars and breakage, as in a conventional mold production process.

Further, when the coating layer is constituted by a material having electroconductivity, it is possible to suppress an occurrence of static electricity, to suppress deposition of ambient dust or contamination.

INDUSTRIAL APPLICABILITY

As described above, according to the present invention, it is possible to achieve a mold provided with a coating layer capable of optical observation during alignment, without losing flatness of the mold. It is also possible to achieve a production process of the mold, a processing apparatus using the mold, and a processing method using the mold.

While the invention has been described with reference to the structures disclosed herein, it is not confined to the details set forth, and this application is intended to cover such modifications or changes as may come within the purpose of the improvements or the scope of the following claims.

The invention claimed is:

1. A mold for imprinting a pattern onto a member to be processed, the mold comprising:
    a mold body having a front surface, at which an imprint pattern is formed, and a rear surface opposite from the front surface;
    a coating layer for covering the front surface of said mold body; and
    a coating layer for covering the rear surface of said mold body,
    wherein an alignment mark as an object to be subjected to optical observation is provided at the front surface of said mold body,
    wherein said coating layer for covering the rear surface includes (i) a hole for observation of the alignment mark and (ii) a stress adjusting pattern corresponding to a density of the imprint pattern,
    wherein the hole for observation is formed at the rear surface of said mold body opposite from the alignment mark,
    wherein the stress adjusting pattern is formed at the rear surface of said mold body opposite from the imprint pattern, and
    wherein said coating layer for covering the front surface is provided at projections of the imprint pattern, but is not provided at recesses of the imprint pattern.

2. A mold according to claim 1, wherein said mold body is formed of a material that is one of (i) transparent to visible light and (ii) at least light in a portion of a wavelength range of optically observable light, and each of said coating layers is formed of a transparent material having an optical characteristic that is different from one of (i) that of said mold body and (ii) an opaque material.

3. A mold according to claim 2, wherein, when each of said coating layers is formed of the transparent material, the transparent material has an optical transmittance capable of curing a photocurable resin material constituting the member to be processed with respect to at least a portion of a wavelength range of ultraviolet rays.

4. A mold according to claim 3, wherein the transparent material and the photocurable resin material have a difference in refractive index therebetween with respect to the portion of the wavelength range of the optically observable light.

5. A mold according to claim 1, wherein each of said coating layers is formed of an electroconductive material.

6. A mold according to claim 1, wherein said coating layer at the front surface of said mold body and said coating layer at the rear surface of said mold body are integral with each other.

7. A mold according to claim 1, wherein only projections are coated with said coating layer for covering the front surface.

8. A mold according to claim 1, wherein only a portion of the front surface is coated with said coating layer for covering the front surface.

* * * * *